(12) United States Patent
Yang et al.

(10) Patent No.: US 7,741,004 B2
(45) Date of Patent: Jun. 22, 2010

(54) METHOD OF FORMING PATTERN BY UTILIZING COATABLE INORGANIC MATERIAL

(75) Inventors: Chin-Tien Yang, Taipei County (TW); Ming-Fang Hsu, Taipei County (TW); Sheng-Li Chang, Hsinchu County (TW); Tzuan-Ren Jeng, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 632 days.

(21) Appl. No.: 11/675,640

(22) Filed: Feb. 16, 2007

(65) Prior Publication Data

US 2008/0160433 A1 Jul. 3, 2008

(30) Foreign Application Priority Data

Dec. 27, 2006 (TW) .............................. 95149219 A

(51) Int. Cl.
G03F 7/00 (2006.01)
G03F 7/004 (2006.01)
B05D 1/36 (2006.01)
B05D 7/00 (2006.01)

(52) U.S. Cl. .................... 430/270.1; 430/905; 427/380; 427/402; 427/414

(58) Field of Classification Search .............. 430/270.1, 430/905; 427/402, 414, 380
See application file for complete search history.

(56) References Cited

U.S. PATENT DOCUMENTS

| 5,510,141 | A | * | 4/1996 | Makita et al. ............... 427/165 |
| 5,630,872 | A | * | 5/1997 | Ogi et al. ............... 106/287.18 |
| 6,037,289 | A | * | 3/2000 | Chopin et al. .................. 502/2 |
| 7,029,831 | B2 | * | 4/2006 | Minami et al. .............. 430/321 |
| 7,419,707 | B2 | * | 9/2008 | Ando et al. .................. 428/1.1 |
| 2004/0170916 | A1 | | 9/2004 | Kouchiyama et al. |
| 2006/0110568 | A1 | | 5/2006 | Edwards |
| 2008/0185291 | A1 | * | 8/2008 | Yang et al. .................... 205/92 |

OTHER PUBLICATIONS

"High-Resolution Blue-Laser Mastering Using an Inorganic Photoresist", by Kouchiyama et al., Jpn. J. Appl. Phys. vol. 42 (2003) pp. 769-771, Part 1, No. 2B, Feb. 2003, The Japan Society of Applied Physics.
"Sub-10 nm Electron Beam Nanolithography Using Spin-Coatable TiO2 Resists", by Saifullah et al., The Nanoscience Centre, Interdisciplinary Research Collaboration in Nanotechnology, University of Cambridge, Nano Letters, 2003 vol. 3, No. 11, 1587-1591.

* cited by examiner

Primary Examiner—Amanda C. Walke
(74) Attorney, Agent, or Firm—Jianq Chyun IP Office

(57) ABSTRACT

A coatable inorganic material is provided, which is suitable for being coated on a substrate in the form of sol-gel solution and then being directly written with thermochemical mode by using a laser beam. The coatable inorganic material is an oxide, in which the chemical element constitution is more than one element selected from Te, Al, Zr, and Ti.

12 Claims, 6 Drawing Sheets

METHOD OF FORMING PATTERN BY UTILIZING COATABLE INORGANIC MATERIAL

CROSS-REFERENCE TO RELATED APPLICATION

This application claims the priority benefit of Taiwan application serial no. 95149219, filed on Dec. 27, 2006. All disclosure of the Taiwan application is incorporated herein by reference.

BACKGROUND OF THE INVENTION

1. Field of the Invention

The present invention relates to a method of forming a pattern. More particularly, the present invention relates to a coatable inorganic material and a method of forming a pattern by utilizing the same.

2. Description of Related Art

According to the minimum spot calculation formula, $S \approx 0.52 \lambda/NA$, of a laser beam direct write lithography process, it is known that an exposure device with higher resolution capability is needed to obtain a capability of defining a pattern with higher density or smaller size in a unit area, in which S is the size of an exposure spot, $\lambda$ is the wavelength of an exposure source, and NA is the numerical aperture (NA) of the system. It is known from the formula that, reducing the wavelength and increasing the NA value can improve the resolution of a laser beam direct write lithography device. However, as for the light source of the laser beam direct write lithography device, the resolution provided by the light source is relative to the wavelength of the light source, so the laser beam direct write lithography has its optical diffraction limit. However, as for the laser beam direct write lithography process, in addition to the resolution capability of the exposure source discussed above, another important factor that affects the pattern definition capability of the laser beam direct write lithography process is the property of the photoresist material. The quality of the property of the photoresist material is reflected by the numerical value $k_1$ in the Rayleigh theory ($\gamma=k_1 \lambda/NA$), so as to test the resolution capability of pattern definition of the entire laser beam direct write lithography process.

In a conventional deep ultraviolet light (DUV) laser beam direct write lithography process, the photoresist generally used is an organic photoresist system. For a laser beam direct write lithography system with a DUV wavelength of 248 nm, 257 nm, or 266 nm, the maximum NA of an adopted objective lens is 0.9, and the minimum spot size thereof is about 150 nm in theory. The above laser beam direct write lithography system employs two different kinds of photo mode organic photoresists generally used at present, which are I-line photoresist and chemical amplified type photoresist (DUV CA photoresist), respectively, and the contrast ($\gamma$) of this kind of photoresist and the obtainable minimum pattern size definition capability are mostly considered in selecting the photoresist. Taking the current research data in general, it is known that the maximum contrast of the I-line photoresist is usually 3, the contrast of the DUV chemical amplified type photoresist is 8, and the optimal pattern resolution thereof can reach the minimum pattern structure size of 130 nm to 180 nm. That is to say, the current DUV laser direct write system with the mentioned organic photoresist cannot meet the requirements of nano-scale pattern definition capability ($\leqq 100$ nm). Additionally, in regard to I-line photoresist, besides having a contrast not high enough, this type of photoresist also has an insufficient transparency to DUV light, such that this photoresist cannot achieve a higher resolution capability. Although the other type of chemical amplified type photoresist has a higher contrast $\gamma$ (about two times of that of the I-line photo resist), the polymer main chain of this type of photoresist is easily contaminated by environment, resulting in the limitation of the usage of this type of photoresist. Further, the I-line photoresist and the chemical amplified type photoresist are composed of a polymer with chain structure of high molecular weight. Thus, the surface roughness of the pattern after development becomes higher due to the molecular cluster property of the polymer.

As described above, for the current DUV laser of 248/257/266 nm and the laser beam direct write lithography system with a high NA of 0.9, if the laser wavelength is further reduced or a near-field optical laser beam direct write lithography system (NA>1) is developed, the mechanical precision and the control precision must be improved, and the component cost and production cost of the device will be greatly increased, thus limiting the development thereof. Therefore, in the nano-scale laser beam direct write lithography technique, it is a major issue to be solved urgently on how to overcome the optical diffraction limit of the laser beam direct write lithography machine. The possibility of using a material process technique together with the existing laser beam direct write lithography system as a solution can not only overcome the seemingly insuperable optical diffraction limit, but also effectively reduce the production cost of the device. Therefore, the objective of the present invention is to improve the pattern definition capability of the laser beam direct write lithography system to reach the nano-scale by developing a novel resist material with a higher resolution capability and a related fabrication method to overcome the laser optical diffraction limit.

In the application development of the nano-scale laser beam direct write lithography, recently a technique of phase transition laser beam direct write lithography process of film formation by a sputtering process has been applied in the current laser beam direct write system, and the steps thereof are as shown in FIG. 1.

Referring to FIG. 1, firstly, in Step 100, a substrate is provided, and then a phase change metal or oxide target material is sputtered on the substrate in the manner of sputtering film formation by a high-vacuum sputtering system (Step 102), and most of this type of inorganic resist material can complete the laser beam direct write lithography process by controlling the phase change between the crystalline and amorphous phase of the alloy thin film. The sputtering resist generally is a chalcogenide material or a metal oxide formed by sputtering, and in this figure a layer of chalcogenide material is taken as an example. Afterward, the layer of chalcogenide material is exposed by a laser (Step 104). Then, an additional specific wet etchant is needed to reserve or remove the region generated through thermochemical reaction, i.e., to develop, so as to form a pattern (Step 106). The resist of the phase change laser beam direct write lithography is an inorganic thermal-mode resist. The reactivity of this type of resist is non-linear, and the heat thereof can be dissipated by diffusion, so the exposure mechanism is stopped. Therefore, this type of resist has a better resolution capability compared with the conventional organic photo mode photoresist recording, and can overcome the optical diffraction limit effectively, i.e., a small pattern can be defined and fabricated by a laser beam direct write lithography with this type of resist.

However, the sputtering phase transition laser beam direct write lithography technique adopts a phase change metal resist film that is sputtered by a high-cost and complicated vacuum sputtering coating system, such that the device cost is much higher than that of the conventional photoresist spin coating film-formation process and the etchant is special. Additionally, the reflectance of the film layer of phase change metal resist is too high, and cannot be used in a focus servo system of the convention laser beam direct write lithography machine. If the film layer of phase change metal resist, utilized in the sputtering phase change laser beam direct write lithography technique, is adopted, it is needed to purchase an entirely new process device, thus resulting in a great increment in the investment of the device.

SUMMARY OF THE INVENTION

Accordingly, the present invention provides a coatable inorganic material, for reducing the surface roughness and the line edge roughness of the formed pattern.

The present invention provides a method of forming a pattern, which has higher compatibility with the conventional process device and is more competitive with a lower cost.

The present invention provides a coatable inorganic material, suitable for being coated on a substrate in the form of sol-gel solution and then being directly written into a pattern with thermochemical mode by using a laser beam. The coatable inorganic material is an oxide, in which the chemical element constitution is more than one element selected from Te, Al, Zr, and Ti.

The present invention further provides a method of forming a pattern, which includes: providing a substrate, and coating a layer of coatable inorganic material on the substrate, in which the layer of coatable organic material is the aforementioned coatable inorganic material; then, utilizing a laser beam to perform direct write exposure on the layer of coatable inorganic material, so as to directly form a relief pattern without carrying out an additional developing and etching process.

In the present invention, as the pattern structure contrast is directly formed with a thermal coatable inorganic material without an additional developing and etching process after a laser beam direct write, the process is simplified and the resolution of the pattern is excellent enough to reach the nano-scale (<100 nm). In addition, as the spin coating process can be adopted, the present invention has the following advantages: no high-vacuum sputtering device system is needed; the material composition is easy to control and the material can be coated on a large-sized substrate; no problem of the crystalline phase and texture of microscopic crystal occurs; and the thickness of the film layer can be controlled by simple parameters (such as rotation velocity and concentration) and is in good uniformity. Additionally, compared with the conventional organic material, the coatable inorganic material of the present invention can effectively improve the surface roughness and the line edge roughness of the pattern formed by the conventional laser beam direct write lithography process.

In order to make the aforementioned features and advantages of the present invention comprehensible, preferred embodiments accompanied with figures are described in detail below.

DESCRIPTION OF EMBODIMENTS

Figure 1:
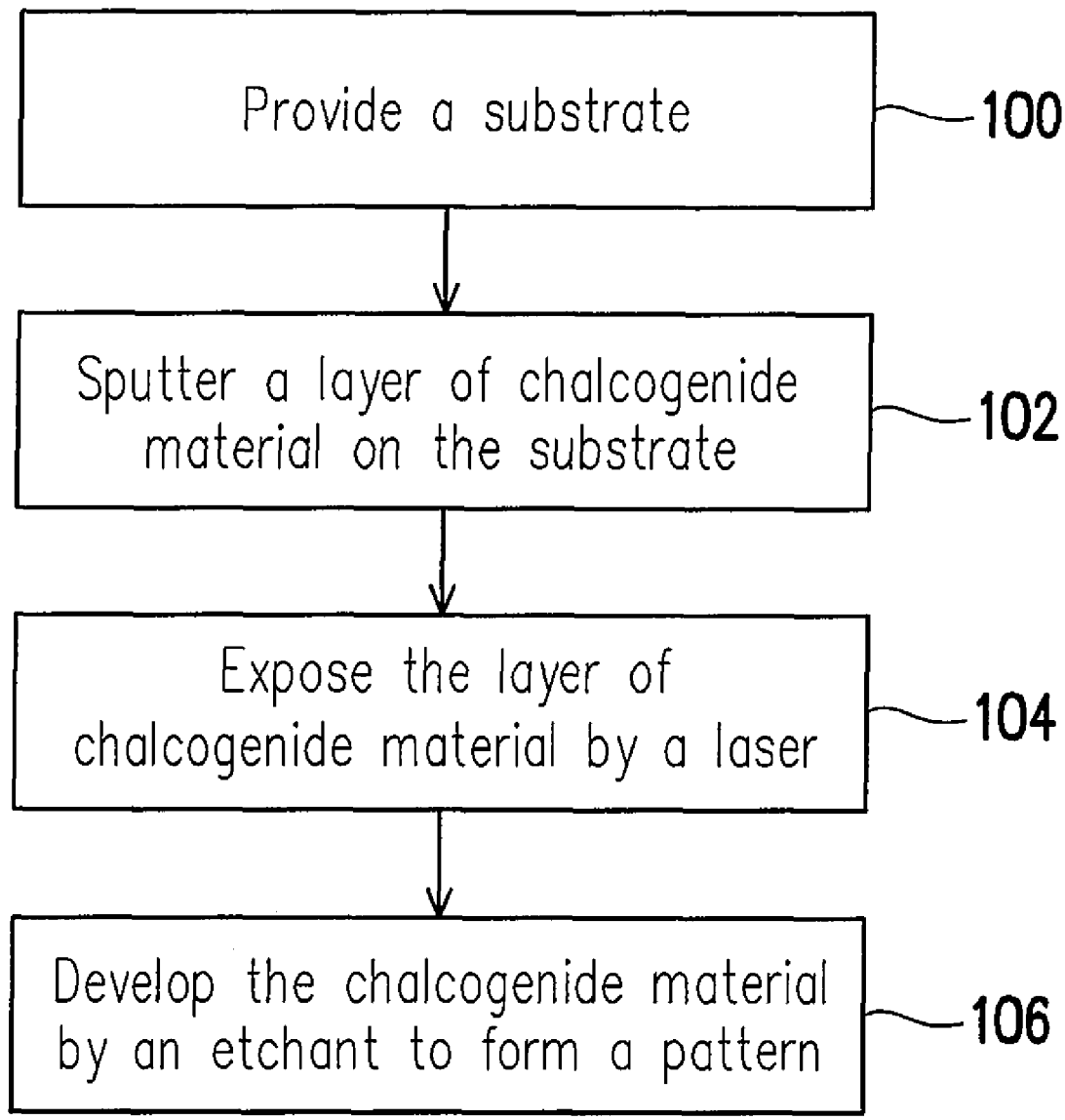
FIG. 1 is a flow chart of forming a pattern in a conventional art.
Figure 2:
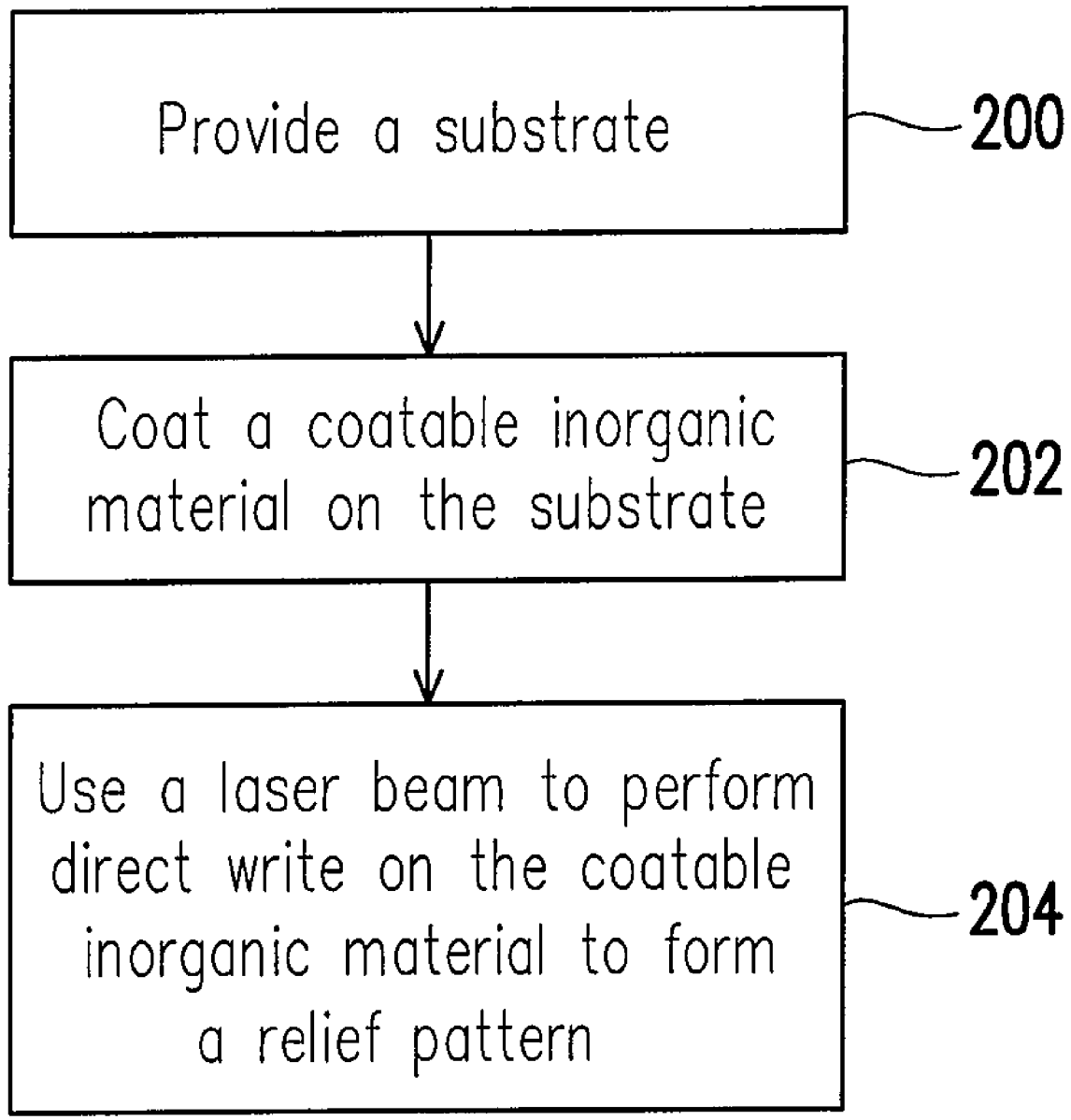
FIG. 2 is a flow chart of forming a pattern according to a first embodiment of the present invention.

FIG. 2 is a flow chart of forming a pattern according to a first embodiment of the present invention.

Referring to FIG. 2, in Step 200, a substrate, for example, a silicon wafer, quartz, plastic, glass, or carbon substrate, is provided, and the category of the substrate mainly depends on the application field thereof. In addition, some processing or processes can be performed on the substrate in advance, so as to form some predetermined elements.

Next, in Step 202, a layer of coatable inorganic material is coated on the substrate, and the coatable inorganic material includes an oxide, in which the chemical element constitution is more than one element selected from Te, Al, Zr, and Ti. The coatable inorganic material is, for example, a low molecular weight sol-gel solution prepared by a sol-gel process. Therefore, the coatable inorganic material further includes β-ketoesters, such as methyl acetoacetate, ethyl acetoacetate, isopropyl acetoacetate, isobutyl acetoacetate, isoamyl acetoacetate; or β-diketoesters, such as acetylacetone (AcAc) or benzoylacetone (BzAc). The synthesis method of the sol-gel solution is illustrated by taking the sol-gel solution of titanium oxide for example as follows: the β-ketoesters or β-diketoesters are mixed with tetra-n-butyl titanate (Ti($OC_4H_9$)$_4$) as a precursor at the room temperature, and then reacted with alcohol for several hours, so as to form a coatable inorganic material sol-gel solution (refer to M. S. M. Saifullah, et al, "Sub-10 nm Electron Beam Nanolithography Using Spin-Coatable $TiO_2$ Resists", *Nano Lett.*, Vol. 3, No. 11, pp. 1587-1591 (2003)). Certainly, according to different materials of the desired layer of coatable inorganic material, the precursor or the process parameters of the above sol-gel process can be adjusted or altered.

Figure 3:
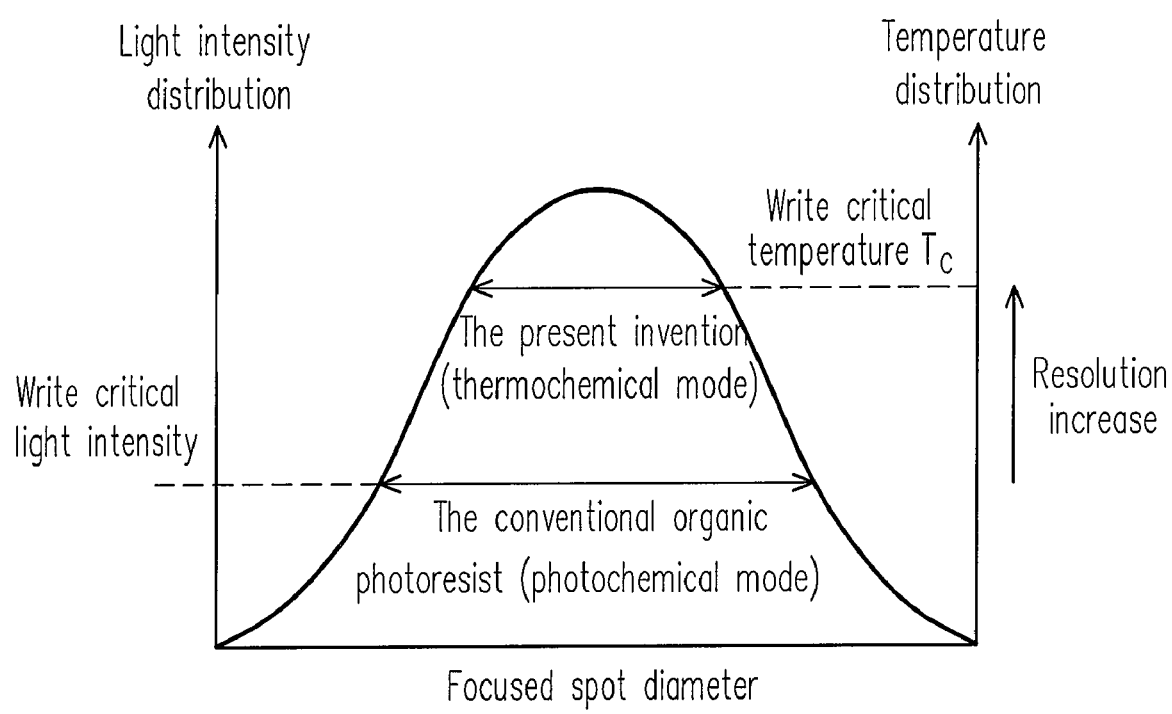
FIG. 3 is a curve diagram showing the light intensity distribution, spot diameter, and temperature distribution of the focused laser spot of the coatable inorganic materials according to the first embodiment and the conventional photochemical mode organic photoresist material.
Figure 4:
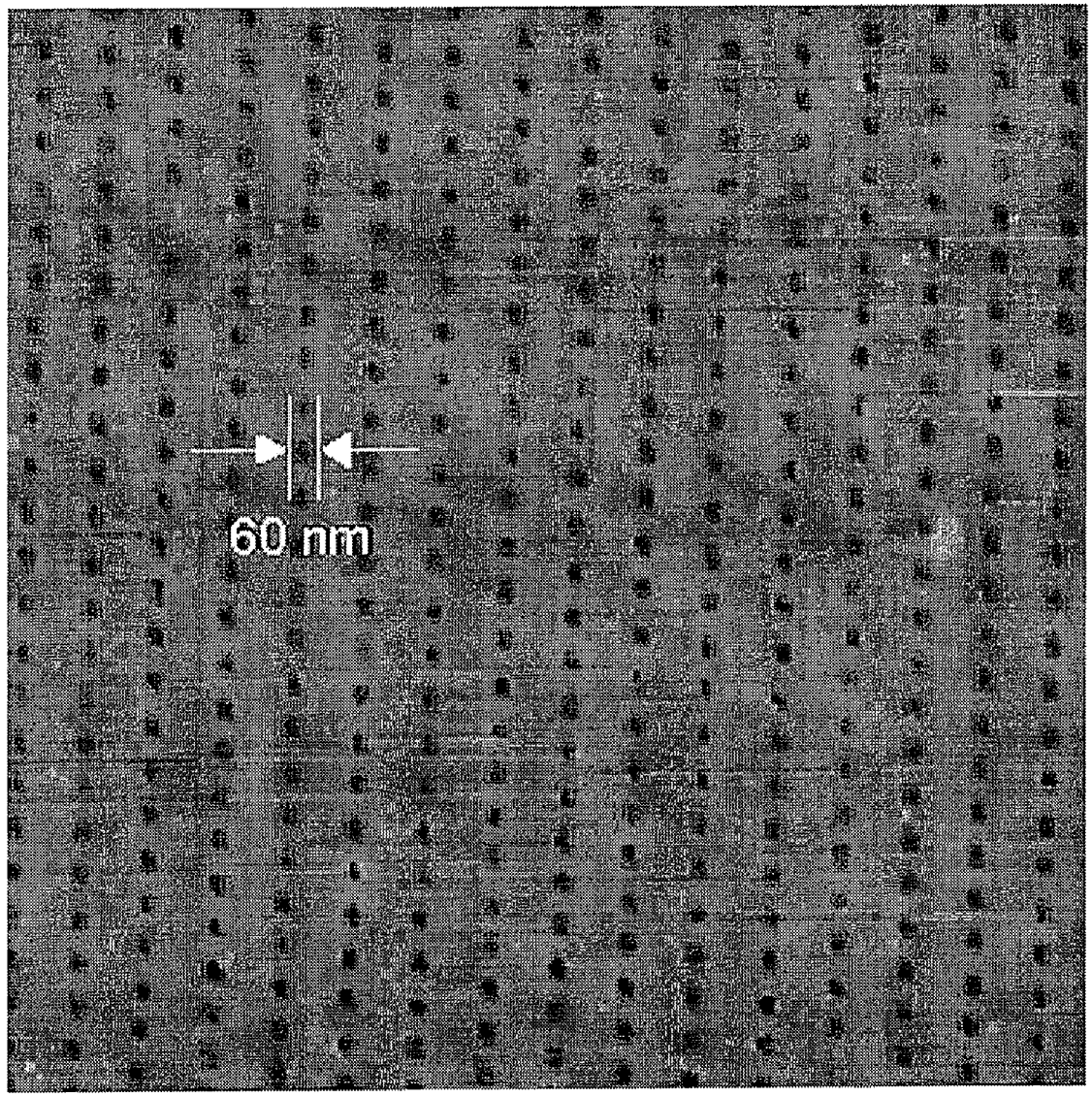
FIG. 4 is a microscopic image taken by atomic force microscopy (AFM) of pits pattern formed with the coatable inorganic material of the present invention after laser direct write.
Figure 5:
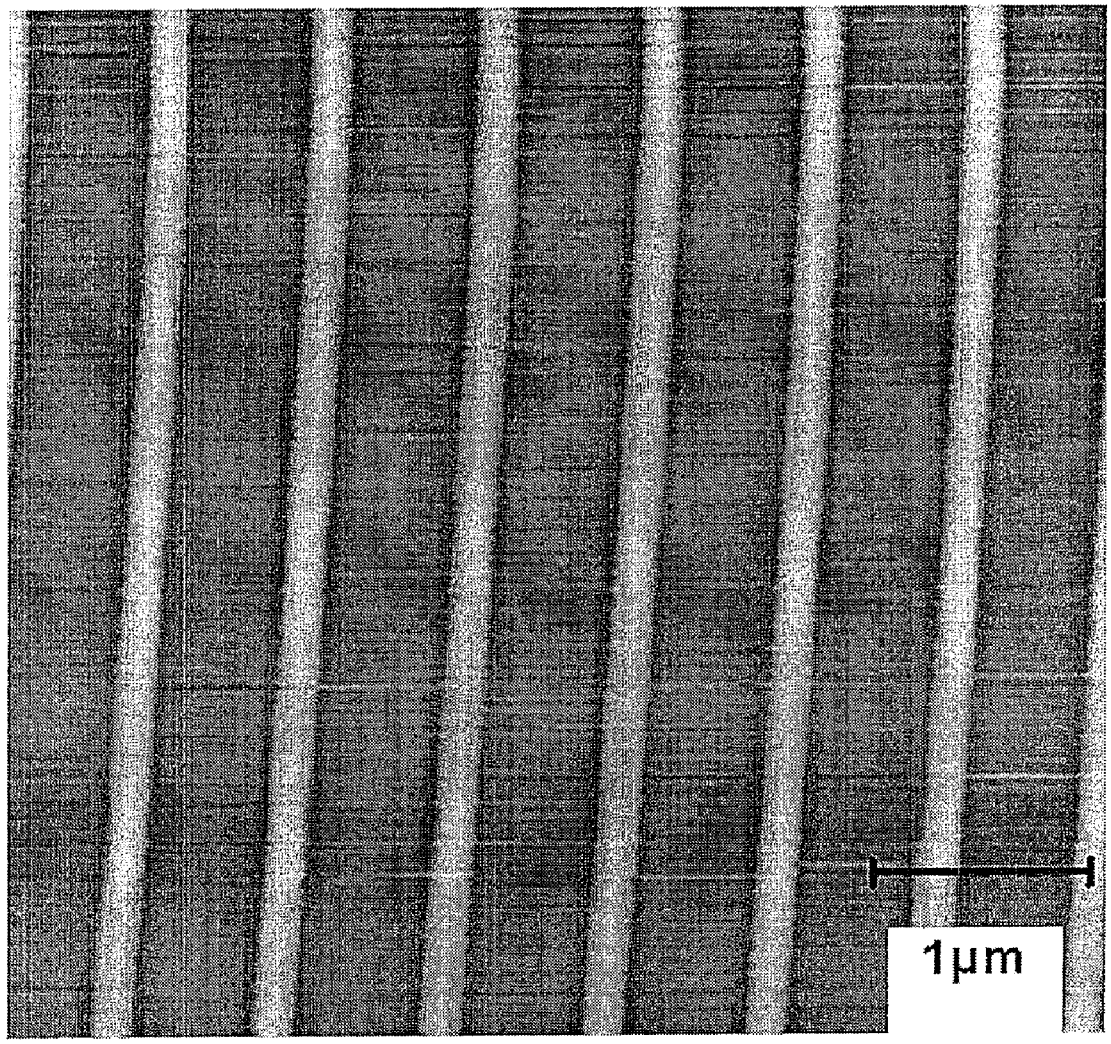
FIG. 5 is a microscopic image taken by AFM of a groove and line pattern formed with the coatable inorganic material of the present invention after laser direct write.

The coatable inorganic material of the present invention is a thermochemical mode coatable inorganic material, which can overcome the optical diffraction limit effectively, and has an improved pattern resolution capability. FIG. 3 is a curve diagram showing the light intensity distribution, spot diameter, and temperature distribution of the focused laser spot of the coatable inorganic materials according to the first embodiment and the conventional photochemical mode organic photoresist material. In FIG. 3, in regard to the conventional photochemical mode organic photoresist material, the size of the recording spot (spot diameter D) is about the size of the diameter of the laser spot. While for the coatable inorganic material according to the first embodiment, only the part of high temperature in the center of the laser beam performs a thermochemical reaction, so this reaction mechanism can scale down the recording spot by about one third to one fourth (spot diameter d) compared with that of the organic photoresist material. Therefore, the pattern definition capability of the coatable inorganic material of the present invention can reach the nano-scale (<100 nm), and the results are as shown in FIG. 4, in which the pit size of the pattern is about 60 nm. Additionally, FIG. 5 shows a groove and line patterns formed with the coatable inorganic material after laser direct write. In contrast to the conventional pattern formed with photo mode organic photoresist, the coatable inorganic material of the present invention has a extremely lower surface roughness and line edge roughness.

Being a low molecular weight sol-gel solution prepared by a sol-gel process, the above-mentioned coatable inorganic material has higher transparency and lower reflectance compared with the sputtering inorganic resist, and the transparency thereof is similar to the conventional organic photoresist. The method of forming a layer of coatable inorganic material on a substrate by coating may include a spin coating process. Additionally, as the coatable inorganic resist according to the first embodiment has a good chemical adhesion to the substrate, no adhesion layer needs to be coated in-between, and thus the process of forming a pattern is simplified.

Afterward, in Step 204, a laser beam is used to perform direct write on the layer of coatable inorganic material, so as to form a relief pattern. In addition, for example, a relief pattern is formed, for example, a laser beam direct write lithography system is used to perform automatic servo focus, so the process in FIG. 2 has a high compatibility with the conventional laser beam direct write lithography process. The laser beam direct write lithography machine may have a light source with a wavelength ranging from DUV to UV wave band, preferably 220 nm to 413 nm. Due to the layer of coatable inorganic material, the formed relief pattern has a quite excellent resolution, and can be a nano-pattern, for example, a relief pattern having grooves or pits. Additionally, the variation of the aspect ratio of the relief pattern can be directly controlled by the power of the laser beam.

Figure 6:
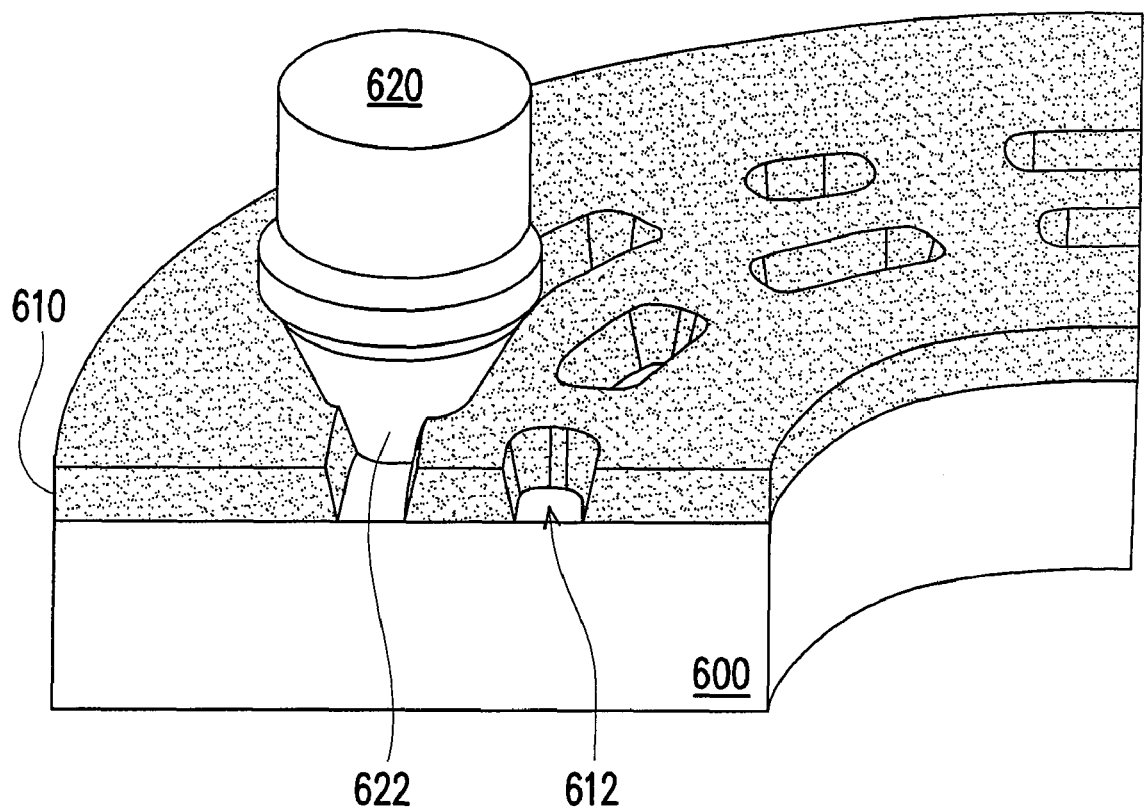
FIG. 6 is a schematic stereogram of a layer of coatable inorganic material during laser beam direct write in Step 204 of FIG. 2.

FIG. 6 is a schematic stereogram of a layer of coatable inorganic material during laser beam direct write in Step 204 in FIG. 2.

In FIG. 6, 600 represents a substrate, 610 represents a layer of coatable inorganic material, 620 represents a lens of a laser beam direct write lithography machine, and 622 represents a laser beam. When the laser beam 622 irradiates the layer of coatable inorganic material 610, grooves or pits 612 are generated directly. Furthermore, after Step 204, the pattern contrast is directly formed without an additional developing and etching process, and the pattern directly formed by the light beam direct write has an improved surface roughness and line edge roughness.

In addition, the material of the present invention can be used in the laser beam direct write lithography technique fabrication fields of the next-generation pattern structure, such as nano-optoelectronics, nano-electronics, energy, high density data storage, and high density optical memory. For example, the fabrication of photonic crystal, or the process of fabricating the antireflection coating or electrode in the solar cell. The reason is that, after the layer of coatable inorganic material for forming a pattern goes through a specific thermal treatment, the material layer with a nano-pattern can be directly used as a functional material structure.

In view of the above, the present invention at least has the following characteristics:

1. The method of the present invention has higher compatibility with the conventional process device and is more competitive with a lower cost than the sputtering film-formation phase transition laser beam direct write lithography process, as the coatable inorganic material of the present invention has high transparency and goes through a spin coating process.

2. As the coatable inorganic material of the present invention goes through a spin coating process, no high-vacuum sputtering device system is needed; the material composition is easy to control and the material can be coated on a large-sized substrate; no problem of the crystalline phase and texture of microscopic crystal occurs as that in the sputtering film-formation phase transition laser beam direct write lithography process technique; and the thickness of the film can be controlled by simple parameters (such as rotation velocity and concentration) and is in good uniformity.

3. The coatable inorganic resist of the present invention is a sol-gel solution, so the problem of low molecular weight and few molecular clusters exists, and no developing and etching process is needed, so the pattern formed has rather low surface roughness and line edge roughness (the minimum can be <1 nm).

4. As for the formation of a pattern according to the present invention, the coatable inorganic material is characterized in directly forming a pattern of grooves or pits in the region exposed by an energy beam on the surface through a thermochemical relief reaction after being exposed by a laser beam energy direct write, so a pattern structure contrast can be formed directly without an additional developing and etching process.

5. The coatable inorganic material of the present invention is used to form a relief pattern by a thermochemical mode, so as to effectively overcome the optical diffraction limit, improve the pattern resolution, and reduce the focused spot diameter of the laser beam to the nano-scale (<100 nm).

Though the present invention has been disclosed above by the preferred embodiments, they are not intended to limit the present invention. Anybody skilled in the art can make some modifications and variations without departing from the spirit and scope of the present invention. Therefore, the protecting range of the present invention falls in the appended claims.

What is claimed is:

1. A method of forming a pattern, comprising:
providing a substrate;
coating on the substrate to form a layer of a coatable inorganic material, wherein the coatable inorganic material comprises an oxide, in which the chemical element constitution is more than one element selected from Te, Al, Zr, and Ti; and
utilizing a laser beam through a thermochemical relief reaction to perform direct write on the coatable inorganic material, so as to directly form a relief pattern without a developing and etching process.

2. The method of forming a pattern as claimed in claim 1, wherein the relief pattern is a nano-pattern.

3. The method of forming a pattern as claimed in claim 1, wherein the relief pattern has grooves or pits.

4. The method of forming a pattern as claimed in claim 1, wherein the variation of the aspect ratio of the relief pattern is directly controlled by the power of the laser beam.

5. The method of forming a pattern as claimed in claim 1, wherein the relief pattern is formed by a laser beam direct write lithography system.

6. The method of forming a pattern as claimed in claim 5, wherein the laser beam direct write lithography system has a light source with a wavelength ranging from DUV to UV wave band.

7. The method of forming a pattern as claimed in claim 1, wherein the method of forming the layer of coatable inorganic material on the substrate comprises a spin coating process.

8. The method of forming a pattern as claimed in claim 1, wherein the substrate material comprises silicon wafer, quartz, plastic, glass, or carbon substrate.

9. The method of forming a pattern as claimed in claim 1, wherein the coatable inorganic material comprises a low molecular weight sol-gel solution.

10. The method of forming a pattern as claimed in claim 1, wherein the coatable inorganic material further comprises β-ketoesters or β-diketoesters.

11. The method of forming a pattern as claimed in claim 10, wherein the coatable inorganic material further comprises methyl acetoacetate, ethyl acetoacetate, isopropyl acetoacetate, isobutyl acetoacetate, or isoamyl acetoacetate.

12. The method of forming a pattern as claimed in claim 10, wherein the coatable inorganic material further comprises acetylacetone (AcAc) or benzoylacetone (BzAc).

* * * * *